United States Patent [19]

Fajen et al.

[11] Patent Number: 5,517,688
[45] Date of Patent: May 14, 1996

[54] MMIC FET MIXER AND METHOD

[75] Inventors: Lyle A. Fajen; Michael Dydyk, both of Scottsdale, Ariz.

[73] Assignee: Motorola, Inc., Schaumburg, Ill.

[21] Appl. No.: 262,719

[22] Filed: Jun. 20, 1994

[51] Int. Cl.$^6$ ............................................. H04B 1/28
[52] U.S. Cl. ..................... 455/333; 455/313; 455/323; 455/326; 327/113; 327/355
[58] Field of Search ........................... 455/333, 313, 455/323, 326, 355, 236.1, 334, 208, 330, 327; 327/355, 356, 358, 359, 361, 113

[56] References Cited

U.S. PATENT DOCUMENTS

| | | | |
|---|---|---|---|
| 3,600,605 | 8/1971 | Lehmann | 307/229 |
| 4,541,122 | 9/1985 | Kimura | 455/236 |
| 4,727,597 | 2/1988 | Dautriche | 455/333 |
| 4,814,649 | 3/1989 | Young | 455/333 |
| 5,339,459 | 8/1994 | Schiltz et al. | 455/333 |

Primary Examiner—Reinhard J. Eisenzopf
Assistant Examiner—Lee Nguyen
Attorney, Agent, or Firm—Jeffrey D. Nehr; Bradley J. Botsch, Sr.

[57] ABSTRACT

A MMIC FET mixer and method includes a RF input port for receiving a RF signal, a feedback control input for receiving a feedback signal, and a LO input port for receiving a LO signal. A feedback controller is coupled to the RF amplifier, the feedback controller for producing a controlled RF signal in response to the feedback signal. A constant current source is coupled to the feedback controller, to the RF amplifier and to the LO input port. The constant current source receives a DC offset voltage, the controlled RF signal, and the LO signal and produces an IF output signal at an IF output port. The IF output signal is proportional to the DC offset voltage, to the RF signal, and to the LO signal.

13 Claims, 2 Drawing Sheets

5,517,688

MMIC FET MIXER AND METHOD

FIELD OF THE INVENTION

This invention relates in general to mixers and in particular to monolithic microwave integrated circuit (MMIC) mixers using field effect transistors (FETs).

BACKGROUND OF THE INVENTION

Mixers are useful components in a large variety of radio frequency (RF) electronic applications. In particular, monolithic microwave integrated circuits (MMICs) are used in low cost, high volume consumer electronics. Many of these consumer electronics are portable, small, and require very small batteries. Given very limited battery life, MMIC circuits in such products must be designed for power efficiency.

The cost of MMIC circuits is proportional to their circuit area. Given a small size requirement, MMICs are designed to use a minimum number of components. Because MMICs are so minute in size, design freedom is actually enhanced because ordinary interconnection parasitics are eliminated along with special tuning components that are often required to cancel the effects of the parasitics.

Conventional radio frequency (RF) mixer circuits use the non-linear characteristics of diodes, driven by a local oscillator (LO) so that the diodes are switched between their non-linear "on" and "off" states. RF signals applied to the non-linear diodes are mixed with the LO drive to produce mixing products (sum and difference frequencies) from which is selected an intermediate frequency (IF). Substantial LO drive power (e.g., 10 milliwatts) is required to switch these diodes to obtain an acceptable IF conversion efficiency with low inter-modulation distortion. The requirement for substantial LO drive necessitates more DC power, reducing battery life when these mixers are used in portable equipment. Conventional mixer circuits also require tuned matching networks to efficiently couple LO and RF energy into the mixing diode elements, making the circuits physically larger and bandwidth limited. Additional circuitry or balancing is required to increase port to port isolation.

The conventional mixer, when directly translated to a MMIC configuration is not power efficient, uses too much circuit area and is relatively expensive, especially for low cost, high volume consumer electronics applications. The conventional mixer circuit is complex because additional components are required to improve voltage standing-wave ratio (VSWR), port-to-port isolation and intermodulation distortion.

DETAILED DESCRIPTION OF THE DRAWINGS

In general, the mixer apparatus described below uses active field effect transistors (FETs), capacitors and resistors embodied within a MMIC substrate with physical dimensions of less than approximately 1.52 mm (0.060 inches) square. The MMIC FET mixer exhibits broad band performance with very low large signal inter-modulation and cross-modulation distortion. The MMIC FET mixer also exhibits conversion gain. Overall power consumption is reduced because the LO power requirement is greatly reduced. Because it is fabricated on a small dimension substrate, the MMIC FET mixer exhibits enhanced performance, as is described below. The MMIC substrate's minute physical and electrical lengths permit RF and DC feedback connections that are not practical with conventionally fabricated discrete element and MIC circuits. Conventional circuit configurations have many parasitic elements which limit all performance parameters. While the mixer and method discussed is particularly suited for the application described below, other applications for the mixer and method will be readily apparent to those of skill in the art.

Figure 1:
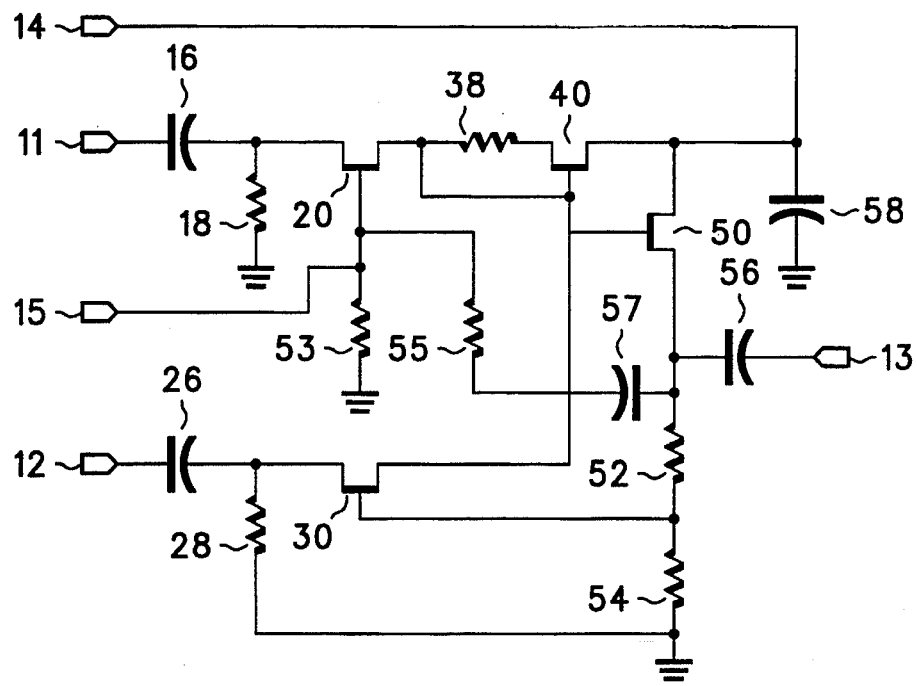
In FIG. 1, there is shown a schematic diagram of an active FET MMIC broadband low distortion mixer in accordance with a preferred embodiment of the invention.

The present invention can be more fully understood with reference to the figures. FIG. 1 illustrates a circuit schematic of mixer 10 in accordance with a preferred embodiment of the invention. The MMIC substrate mixer 10 shown in FIG. 1 is comprised of capacitors, resistors and active FETs interconnected between five pods: a RF input port 11, a LO input pod 12, an IF output port 13, a DC supply voltage input pod 14 and a feedback control input 15 which is used to significantly increase the third-order intercept point performance. A high third-order intercept point establishes low inter-modulation and cross-modulation performance of mixer 10 under large input signal conditions.

Resistor values are not shown in FIG. 1 because a wide variation is possible, depending upon the selection of the FETs and FET sizes. The ratio of resistance values is of primary importance because DC bias is most important for optimum performance. For a MMIC application, resistor ratios are easily controlled and with a DC feedback control built into the design, stable performance is also guaranteed from wafer to wafer and die to die. For a point of reference, in a preferred embodiment of this design, transistor 50 has twice the area of transistor 40. FETs 20 and 30 are identical and one half the area of FET 40. Resistors 18 and 28 are equal and twice the value of resistor 38. Resistor 52 is 24 times the value of resistor 54. The basic ratio of values of resistors 18, 28 and 52 are set for best conversion gain and optimum port VSWR performance consistent with minimum power drain. Typical DC current drain for the preferred embodiment shown is less than three milliamperes (mA) with five volts (V) applied to port 14. Each of capacitors 16, 26, 56, and 57 has a 5 picofarad (pF) capacitance.

In FIG. 1, FET 40 in conjunction with resistor 38 operates as an active nonlinear resistance, proportionate to the DC offset ($V_{DG}$) and peak-to-peak amplitude of the amplified RF signal and the dominant amplified LO signal applied to the gate of FET 40. In other words, FET 40 behaves as a constant current device with varying drain to source resistance proportional to any gate applied DC, RF, or LO voltage wave form. It replaces the non-linear diode elements found in conventional mixer designs. The average non-linear resistance value of FET 40 in series with resistor 38 varies as a ratio of $V_{DG}/I$, where 1 is the constant current through FET 40. This equivalent resistance is significant, providing several dB of signal gain from FETs 20 and 30 without RF tuning or the use of additional impedance matching components. To obtain the same gain performance without regard to mixing performance would require a very large fixed resistor and a supply voltage several times the normal breakdown limits of transistors 20 and 30.

A RF signal to be translated to an IF signal is applied to port 11. A coupling capacitor 16 is connected between pod 11 and the junction of resistor 18 and the source of transistor 20. The other end of resistor 18 is returned to common ground. The gate of transistor 20 is connected to the junction of resistors 53 and 55 and is also accessed via port 15. The opposite end of resistor 55 is grounded.

Port 15 is used to control the amount of negative RF feedback applied to transistor 20 from the source output of transistor 50 via resistor 56 and coupling capacitor 57. Normally, pod 15 is grounded, shorting out resistor 53 so that no RF feedback is applied. When large signal operation is desired with minimum mixer output distortion, a fixed or active variable resistance is connected at port 15. Increased feedback significantly reduces inter-modulation and cross-modulation products. Concurrent RF to IF conversion gain of mixer 10 in this configuration is reduced slightly.

Automatic control can be effected by using active FETs as voltage variable resistors in place of resistor 53 and/or resistor 55. The circuitry for each voltage variable resistor could be identical to FET 40 in combination with resistor 38 with appropriate DC isolation at the gate of FET 20. The control voltage for this automatic operation in a typical radio receiver application could be a voltage derived from the receiver's automatic gain control leveling circuit.

LO signal is applied to port 12. Coupling capacitor 26 is connected between port 12 and the junction of resistor 28 and the source of transistor 30. The other end of resistor 28 is connected to common ground. The gate of FET 30 is tied to the junction of resistors 52 and 54. The other end of resistor 54 is connected to common ground. The drains of FETs 20 and 30 are joined together, to resistor 38 and also to the gates of FETs 40 and 50. The other end of resistor 38 is connected to the source of FET 40. The drains of FETs 40 and 50 are tied together, to RF bypass capacitor 58, and to port 14, which is the common DC voltage input for the MMIC chip. The other end of capacitor 58 is connected to common ground. The source of FET 50 is attached to the junction of resistor 52, capacitor 56 and capacitor 57. The other end of capacitor 56 is attached to port 13, where the RF, the LO, the converted sum and difference frequencies and all mixing products, including the desired IF are available.

FETs 20 and 30 are operated as linear class A common gate amplifiers for the respective RF and LO signals. Operating in this mode, a relatively low VSWR 50-ohm input impedance to the RF and LO signals is provided at ports 11 and 12. Also provided is high isolation between ports 11 and 12. A secondary advantage of using the common gate FET configuration is signal fidelity. The phase relationship between the drain and source is 0 degrees-therefore no harmonic distortion is introduced when large signal RF or LO inputs are introduced. There is no conflict between the source and drain amplitudes. Low harmonic distortion contributes to low inter modulation and cross modulation performance of mixer 10. Any self-generated harmonic distortion is further reduced because FET 30 receives DC and RF negative feedback. This feedback is established with the gate of FET 30 tied to the junction of resistors 52 and 54, sampling the total RF and DC outputs of mixer 10.

The amplified and mixed RF and LO signals are input in parallel to the drains 5 of FETs 20 and 30 and to the gates of FETs 40 and 50. FET 50 operates as a linear Class A source follower to provide electronic impedance transformation from the varying resistance of FET 40 and resistor 38 to a lower, isolated resistance value suitable for IF filtering and subsequent IF amplification. Resistors 52 and 54 form an appropriate voltage divider for negative DC and RF feedback applied to the gate of FET 30 to establish a low distortion Class A operating point which is stable over temperature and to compensate for normal MMIC foundry FET, capacitor and resistor parameter variation.

Figure 2:
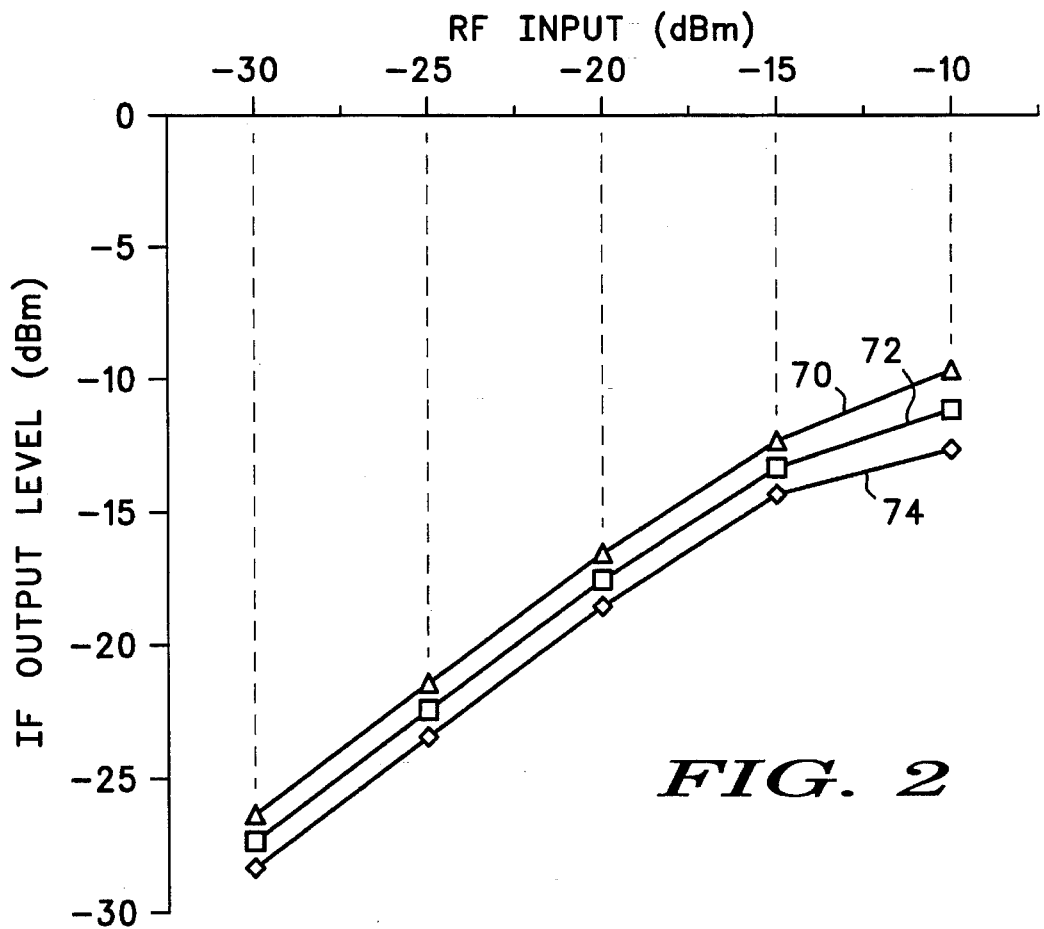
In FIG. 2, there is shown a graph of measured IF conversion performance of the FIG. 1 mixer; and In FIG. 3, there is shown a graph of the conversion gain and return loss versus frequency of the FIG. 1 mixer.

In FIG. 2, measured performance of the preferred embodiment is shown in terms of IF output versus RF input drive levels as a function of LO drive level. Lines 70, 72, and 74 illustrate performance for drive levels of 10 dBm, 6 dBm, and 0 dBm, respectively. The circuit represents a nominal configuration with no RF feedback and minimum dimension FETs for very small signal operation. Larger FETs and smaller resistors will provide improved performance for applications where higher RF and LO drive levels are specified. When improved linearity and higher third order intercept performance is desired, RF feedback can be increased by increasing the resistance between the gate of transistor 20 and ground. The effect will raise the saturation point by 10 dB and decrease in conversion gain by 3 dB. With the embodiment tested, the RF drive was varied between −30 dBm to −10 dBm, while the LO drive level was varied between 0 and 10 dBm. The IF output with RF drive levels below −30 dBm is exactly linear and proportional and not shown.

The resulting IF output levels demonstrate conversion gain for all LO drive levels when the RF input drive levels are less than −20 dBm. Above −10 dBm, the conversion gain decreases to 3 dB loss because of normal circuit saturation characteristics. A low level of LO drive means that less battery power is needed to provide specified IF output level.

Figure 3:
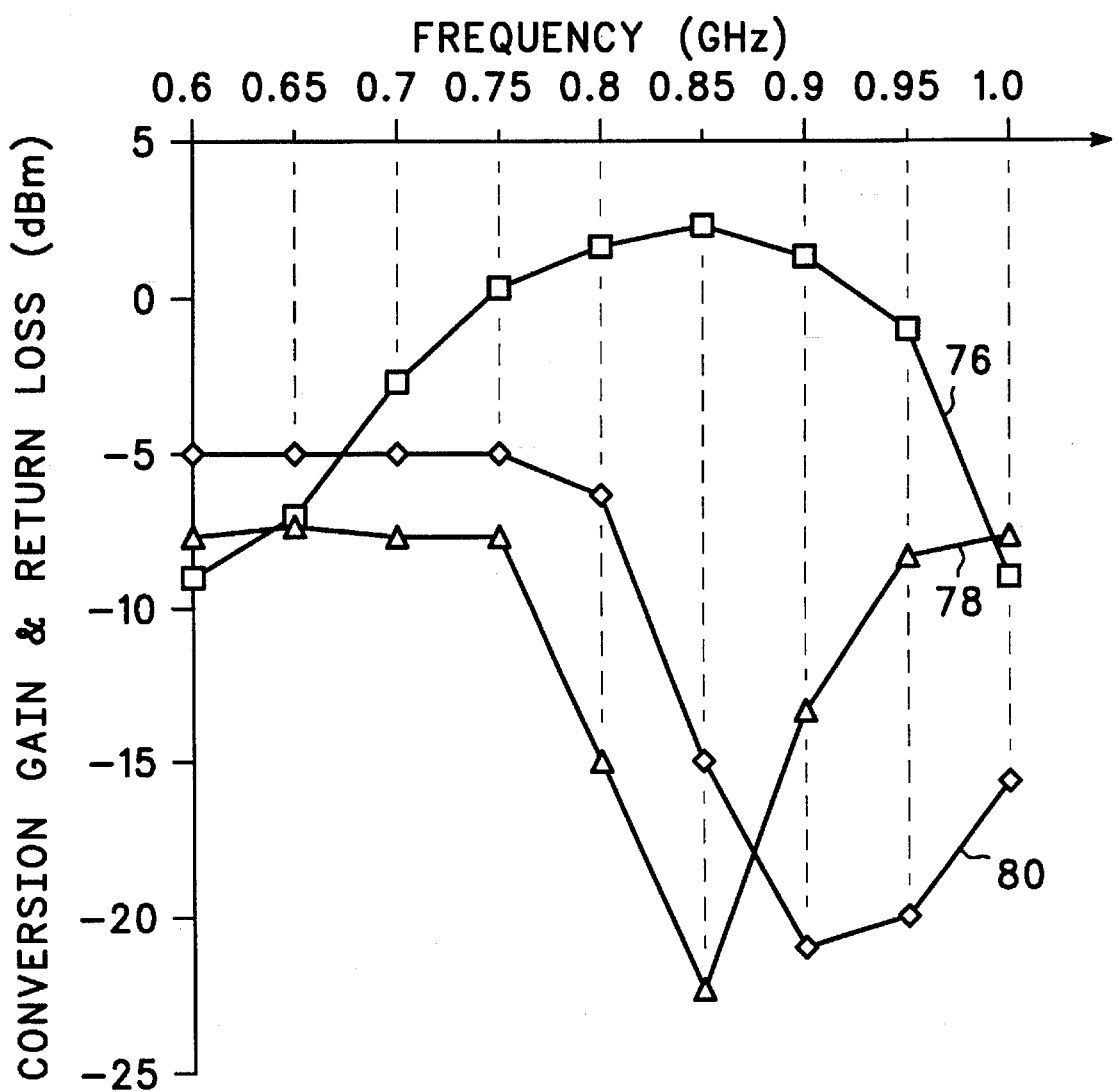

FIG. 3 illustrates measured conversion gain, LO/RF port return loss (VSWR) and IF port return loss (VSWR) for the embodied circuit optimized for operation between 0.8 and 0.9 GHz. Line 76 illustrates the conversion gain, line 78 the IF port return loss, and line 80 the RF and LO return loss. VSWR optimization is dependent upon the design values selected for the port coupling capacitors 16, 26 and 56 in FIG. 1. For the 0.8 to 0.9 GHz frequency range, these capacitor values in the preferred embodiment are each 0.5 pF. Maximum conversion gain occurs where the port VSWRs are minimized. Higher frequency performance is a function of FET parameters supplied by the MMIC foundry. Higher frequency performance is possible with smaller area FETs. Low frequency, higher power level performance requires larger area FETs.

Thus, a MMIC FET mixer and method has been described which overcomes specific problems and accomplishes certain advantages relative to prior art methods and mechanisms. The improvements over known technology are significant. The MMIC FET mixer overcomes the problems of low DC efficiency, low conversion efficiency, low port to port isolation, high input and output VSWR, high inter-modulation distortion, high cross-modulation distortion, and large circuit area. The MMIC FET mixer is particularly well suited to use in high volume, low cost RF equipment, since it offers the advantages of MMIC technology with minimum circuit area, simplified circuitry, high efficiency and improved performance.

Thus, there has also been provided, in accordance with an embodiment of the invention, a MMIC FET mixer and method that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A monolithic microwave integrated circuit (MMIC) mixer comprising:

a RF amplifier for receiving a RF signal and for producing an amplified RF signal;

a feedback control input for receiving a feedback signal;

a feedback controller coupled to the RF amplifier, the feedback controller for causing a controlled RF signal to be produced from the RF amplified signal in response to the feedback signal;

a LO amplifier for receiving a LO signal and for producing an amplified LO signal;

a DC offset voltage; and an active resistor coupled to the RF amplifier, to the LO amplifier, and to the DC offset voltage, the active resistor for receiving the controlled RF signal and the amplified LO signal and for producing an IF output signal at an IF output port, wherein the IF output signal is proportional to the DC offset voltage, to the controlled RF signal, and to the amplified LO signal.

2. A MMIC mixer as claimed in claim 1, further comprising a second amplifier coupled between the active resistor and the IF output port, wherein the second amplifier is also coupled to the LO amplifier.

3. A MMIC mixer as claimed in claim 2, wherein the second amplifier comprises a FET source follower amplifier, wherein a gate of the FET source follower amplifier is coupled to the active resistor.

4. A MMIC mixer as claimed in claim 2, wherein the LO amplifier comprises a FET amplifier.

5. A MMIC mixer as claimed in claim 4, further comprising a voltage divider coupled between the second amplifier and the LO amplifier, wherein the voltage divider establishes an operating point for the LO amplifier, a gate of the LO amplifier is coupled to the voltage divider, and the feedback controller is coupled to a common connection of the second amplifier and the voltage divider.

6. A method for mixing an RF signal with a LO signal to produce an intermediate frequency (IF) signal, the method comprising the steps of:

providing an RF signal, a LO signal, and a feedback signal;

amplifying the RF signal and the LO signal to produce an amplified RF signal and an amplified LO signal, respectively;

providing a constant current source with varying resistance proportional to the amplified RF signal and to the amplified LO signal;

controlling negative RF feedback using the feedback signal thereby producing an adjusted, amplified RF signal; and mixing the adjusted, amplified RF signal and the amplified LO signal to produce an IF output signal, where the IF output signal is proportional to the adjusted, amplified RF signal, to the amplified LO signal and to a DC offset voltage.

7. A method as claimed in claim 6, wherein the step of amplifying the RF signal and the LO signal comprises the step of amplifying the RF signal and the LO signal in linear class A common gate amplifiers.

8. A method as claimed in claim 6, further comprising the step of automatic voltage control using active FETs as voltage variable resistors.

9. A method as claimed in claim 6, wherein the step of controlling negative RF feedback comprises the step of applying an active variable resistance for large signal operation with minimum mixer output distortion.

10. A monolithic microwave integrated circuit (MMIC) mixer comprising:

a RF amplifier for receiving a RF signal and for producing an amplified RF signal;

a feedback control input for receiving a feedback signal;

a feedback controller coupled to the RF amplifier, the feedback controller for causing a controlled RF signal to be produced from the RF amplified signal in response to the feedback signal;

a LO amplifier for receiving a LO signal and for producing an amplified LO signal;

a DC offset voltage; and a constant current source coupled to the RF amplifier, to the LO amplifier, and to the DC offset voltage, the constant current source for receiving the controlled RF signal and the amplified LO signal and for producing an IF output signal at an IF output port, wherein the IF output signal is proportional to the DC offset voltage, to the controlled RF signal, and to the amplified LO signal.

11. A MMIC mixer as claimed in claim 10, further comprising a second amplifier coupled between the constant current source and the IF output port, wherein the second amplifier comprises a linear class A source follower.

12. A MMIC mixer as claimed in claim 11, wherein the LO amplifier comprises a linear class A common gate amplifier.

13. A MMIC mixer as claimed in claim 12, further comprising a voltage divider coupled between the second amplifier and the LO amplifier, wherein the voltage divider establishes an operating point for the LO amplifier.

* * * * *